(12) United States Patent
Cooke et al.

(10) Patent No.: US 6,701,474 B2
(45) Date of Patent: Mar. 2, 2004

(54) SYSTEM AND METHOD FOR TESTING INTEGRATED CIRCUITS

(75) Inventors: Laurence H. Cooke, Los Gatos, CA (US); Christopher K. Lennard, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 439 days.

(21) Appl. No.: 09/888,054

(22) Filed: Jun. 22, 2001

(65) Prior Publication Data

US 2002/0091979 A1 Jul. 11, 2002

Related U.S. Application Data

(60) Provisional application No. 60/216,746, filed on Jul. 3, 2000, and provisional application No. 60/214,928, filed on Jun. 28, 2000.

(51) Int. Cl.$^7$ .............................................. G01R 28/31
(52) U.S. Cl. ...................... 714/724; 714/726; 714/729; 714/733; 714/737
(58) Field of Search ......................... 364/579, 488–490; 714/726–729, 731, 733, 737

(56) References Cited

U.S. PATENT DOCUMENTS

| | | | |
|---|---|---|---|
| 4,872,169 | A | 10/1989 | Whetsel, Jr. |
| 5,539,652 | A | 7/1996 | Tegethoff |
| 5,838,583 | A | 11/1998 | Varadarajan et al. |
| 6,286,128 | B1 | 9/2001 | Pileggi et al. |
| 6,292,929 | B2 | 9/2001 | Scepanovic et al. |
| 6,311,302 | B1 | 10/2001 | Cassetti et al. |

OTHER PUBLICATIONS

"Virtual Socket Interface Alliance (VSLA)"; VCI Standard OCB, Version 1; Dec. 9, 1999; p. 57.

*Primary Examiner*—Albert Decady
*Assistant Examiner*—Aleksandr Yufa
(74) *Attorney, Agent, or Firm*—Bingham McCutchen LLP

(57) ABSTRACT

A method of testing an integrated circuit including component blocks of random logic in a manufacturing environment is disclosed. The method includes the steps of performing built-in self tests, at least in part to test memory and data paths of the integrated circuit, performing diagnostics tests, at least in part to test the component blocks of random logic individually, performing stress tests using test vectors, at least in part to test the component blocks of random logic collectively; and performing scan-based tests of the integrated circuit, at least in part to test for structural faults in the integrated circuit.

63 Claims, 10 Drawing Sheets

TESTBENCH FEATURES

- MEMORY ON-CHIP LOCKABLE AND SPECIFIABLE AS A TARGET FOR EXTERNAL LOAD

- INTERNAL COMPONENT BLOCKS HAVE A TARGET INTERFACE FOR DIRECT LANDING VIA "TEST PORT"

- FOLD-BACK IMPLEMENTED AT CHIP I/O INTERFACES

- HIGH-SPEED DATA TRANSACTION CAPABILITY BETWEEN THE PROBE CARD AND THE DUT

- MEMORY INCLUDED ON THE PROBE CARD TO REDUCE BANDWIDTH TO THE TESTER

- TEST PORT CONNECTED TO SYSTEM BUS FOR LOADING DIAGNOSTICS DIRECTLY ONTO THE DUT

- CLOCK ON THE PROBE CARD

- ANALOG INTERFACES CONVERTED TO DIGITAL

- MINIMAL INPUT DATA FOR TEST VECTORS FROM TESTER

- SEPARATE POWER SUPPLIES FOR PROBE CARD AND DUT

- DIRECT INTERFACES BETWEEN THE TESTER AND THE PINS OF THE DUT

*FIG. 7*

EXAMPLE OF ON-CHIP FOLD BACK

FOLD-BACK OFF PROBE CARD

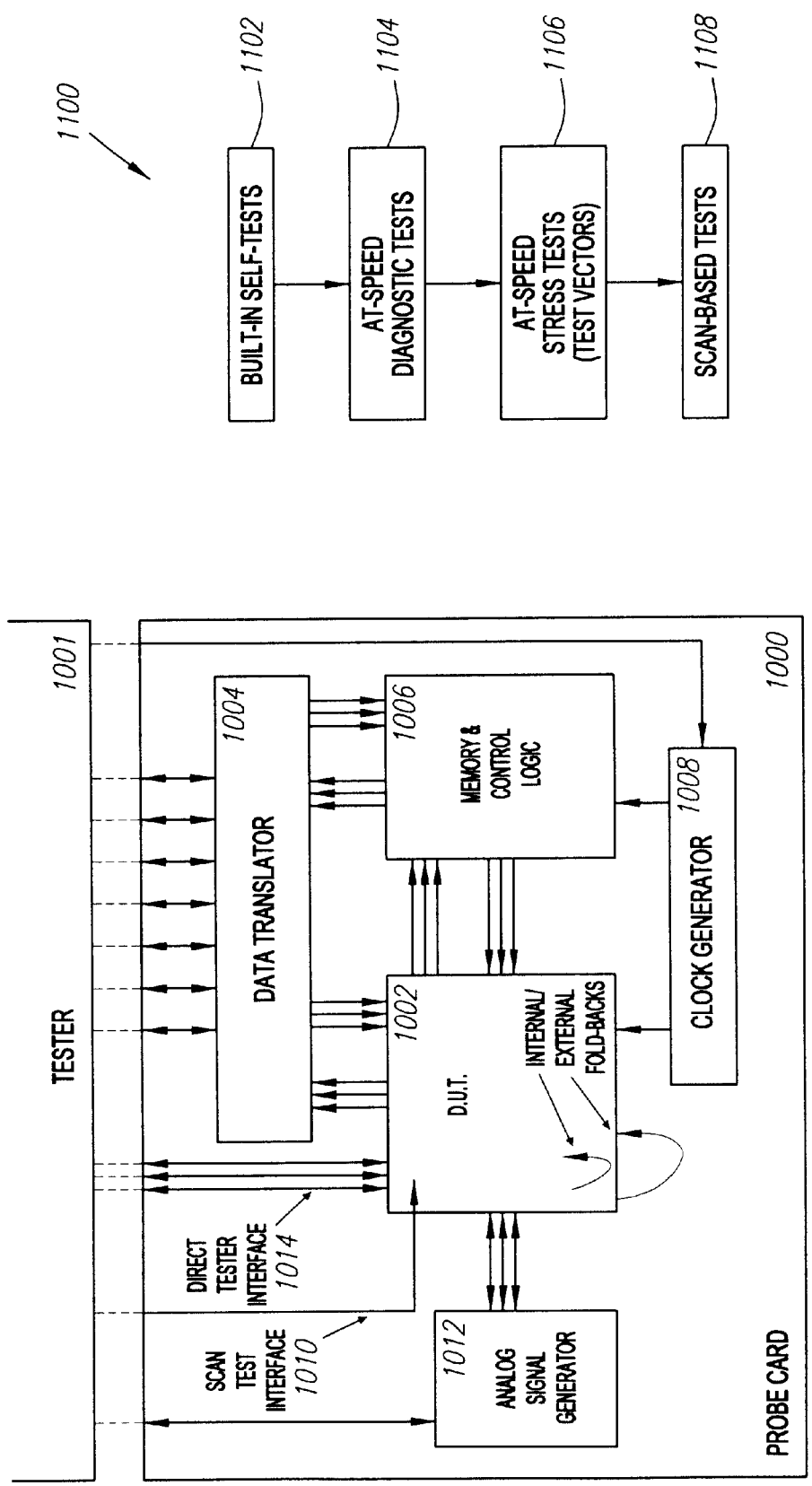

SYSTEM AND METHOD FOR TESTING INTEGRATED CIRCUITS

This application claims priority to a U.S. Provisional Application entitled "System-on-a-Chip-1," having Serial No. 60/216,746 and filed on Jul. 3, 2000, and a U.S. Provisional Application entitled "System and Method for Test and Verification of Circuit Design Incorporating Virtual Circuit Blocks," having Serial No. 60/214,928 and filed on Jun. 28, 2000, both of which are hereby incorporated by reference as though fully set forth herein.

BACKGROUND OF THE INVENTION

1. Field of the Invention

The field of the present invention relates to electronic design automation and, more particularly, to methods and systems for testing integrated circuits during manufacturing and/or fabrication stages.

2. Background

Circuit chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer designs a circuit by inputting information at a computer workstation generally having a high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity. After this specific cell-to-cell connectivity has been established, the physical design and layout software creates a physical layout file of the integrated circuit, including the physical position of each metal line (i.e., wire) and each via (i.e., metal transition between chip layers).

As a last step before creation of the mask file for delivery to the fabrication facility, the physical verification and layout validation software performs several design rule checks (DRCs) on the layout file. More recently, in order to handle very large and complex designs, a netlist is created for each section or block in the design. The subsequently placed and routed blocks are then hierarchically viewed as "cells" at the next, full design level, and again placed and routed to form the layout of the whole chip. In this hierarchical approach, the DRCs are also performed hierarchically. Further explanation of a particular chip design process is set forth, for example, in U.S. Pat. No. 5,838,583, hereby incorporated by reference as if fully set forth herein.

During fabrication at a semiconductor foundry, integrated circuits are typically manufactured on semiconductor wafers as part of a multi-step process. A single integrated circuit design is generally duplicated numerous times over a single semiconductor wafer, with iterations of the integrated circuit laid out evenly in rows and columns on the semiconductor wafer. Fabrication of a semiconductor wafer containing integrated circuits may involve etching, deposition, diffusion, and cleaning processes, all carried out within specified tolerances.

Typically, some of the integrated circuits on the semiconductor wafer will not be suitable for commercial use due to imperfections in the manufacturing process. The number of integrated circuits on each wafer that will be problematic depends in part on the quality and consistency of the fabrication process. However, despite the often best efforts of semiconductor foundries, there will usually be a number of integrated circuits on each wafer that need to be rejected, even though the design "blueprint" is correct, because during the fabrication process electrical components do not meet the proper tolerances, because electrical connections that should be made are not sufficiently conductive, because electrical paths that should be isolated become too close together or shorted, or because of other imperfections that may occur at any point in the etching, deposition, diffusion or cleaning processes. The endless push to decrease the size of integrated circuits, including the micro-circuitry, wires and components forming a part thereof, merely increases the likelihood that imperfections will occur during the fabrication process requiring rejection of at least some (and sometimes all) of the integrated circuits on a semiconductor wafer.

After the fabrication process, a semiconductor wafer typically goes through a packaging process in which the wafer is diced into dies and then packaged for shipment or integration in electronic devices. The failure to identify problematic integrated circuits before such shipment or integration can be devastating. If an imperfect integrated circuit is not identified before shipping, it may be placed in a product and sold to a consumer or end user, whereupon it will eventually fail during operation. Besides hurting the reputation of the chip designer and semiconductor fabrication facility, such operational failures can also cause major problems to the application of the consumer or end user. Furthermore, the cost of replacing the whole defective product is much greater than removing the defective component from the manufacturing process before it is assembled into the final product.

Consequently, integrated circuits should to be tested to ensure that they will operate properly. Such testing may occur at the point when fabrication of the semiconductor wafer complete and/or after the die has been packaged. A variety of tests have been developed for use during either one of these stages of manufacturing. Most of the tests are administered through a "probe card" connected to an automated machine. The probe card is a test fixture that makes direct contact with the integrated circuit being tested (also known in this context as the "device under test" or "DUT"). In one form, the probe card includes an electrical interface that is compatible with the DUT. The automated machine controlling the probe card generally includes a computer that has various stored test information developed by the design or test engineers specifically for the DUT. The classes of tests carried out may include functional tests, such as diagnostic tests and stress tests, for ensuring that the functionality of the integrated circuit is complete, and structural tests, such as built-in self-tests (BISTs) and scan-based tests, for ensuring that no structural faults exist in the logic of the DUT.

One of the considerations to selecting the type(s) of test to employ for an integrated circuit is the amount of time each test requires. Because integrated circuits are often part of a mass production process, in which tens of thousands or even millions of units may be produced, even relatively short tests can, in the aggregate, result in significant processing delays. Moreover, post-fabrication tests typically require expensive, specialized test equipment, which can run in the tens of thousands or millions of dollars per test machine. Because integrated circuits increasingly include millions or tens of millions of gates, conventional testing techniques are fast becoming either too time-consuming or ineffective at fully testing integrated circuits. For the same reason, the cost of testing is rapidly becoming the most expensive part of manufacturing an integrated circuit.

A drawback with conventional test procedures is that large amounts of data, in the form of test patterns, often need to be transferred between the tester and the internal circuitry of the integrated circuit, via the probe card connected to the integrated circuit. With potentially millions of gates to be tested on a single integrated circuit, the test patterns can be lengthy. Using the normal interface circuitry of the integrated circuit to load the test patterns and read out the results can take a relatively long amount of time. At-speed stress tests, which typically test system-level functionality at the operational performance limits of the integrated circuit, can be particularly difficult to implement, due to bandwidth constraints between the tester and the integrated circuit device under test.

Some attempts have been made to increase the speed of testing by using a higher speed tester (e.g., one with a speed of 200 MHz, as opposed to the more typical 25 MHz). However, high-speed testers can be inordinately expensive. Also, at such high speeds, the length of the wires connecting the tester to the integrated circuit (via the probe card) can become a significant speed-limiting factor, due to impedances that are in part frequency related. Therefore, very short wires are needed to run a high-speed test, which places design constraints on the test equipment and makes the automated operation of the test equipment potentially more burdensome and expensive.

Another suggested solution has been to include additional test I/O pins on the devices being tested. The problem with this approach is that any improvement is at best linear, and therefore is relatively insignificant in comparison to the increase in the density of gates to be tested for an integrated circuit. Multiple scan test strings might be input into the DUT using the additional test I/O pins, but again the improvement in performance has a low ceiling because of the limited real estate for additional pins. Furthermore, by including additional test pins, the cost for chip packaging increases.

Along the same lines, using signal I/O pins for test has also been suggested to more quickly transfer the test inputs into the DUT. To do this, test and usage I/O are multiplexed for some portion of the set of signal I/O pins. This option, however, incurs performance overhead. Moreover, because the real estate for I/O pins is limited, this alternative provides too limited an advantage.

One of the new developments in circuit designs is the advent of so-called virtual component blocks, which, from a general standpoint, are pre-designed and pre-hardened (or semi-hardened) circuit designs in software form (for example, in GDSII format), which can be readily re-used or recycled in different, larger circuit designs. An advantage of virtual component (or VC) blocks is that they reduce the time to design an overall circuit, and thereby increase the speed to market. Virtual component blocks can also be verified from a logical and functional standpoint, also saving time in the verification portion of the design process.

While virtual component blocks have been found to be convenient from a design perspective, when incorporated in a larger circuit design and fabricated on silicon, they are still subject to fail either due to flaws in the manufacturing process, or due to problems arising from attempted integration into the larger circuit design. Therefore, as with any other type of integrated circuit, integrated circuits based in part on virtual component blocks generally need to be tested and verified at the manufacturing stage to ensure proper functioning. Consequently, according to conventional electronic design automation processes, new tests (whether functional, diagnostic or stress tests) need to be written for each new integrated circuit design incorporating a virtual component block, just as with any other type of new integrated circuit design. These tests can be as time consuming and expensive to design as they are to execute during manufacturing, as mentioned above.

Accordingly, it would be advantageous to provide an improved means for testing integrated circuits, including designing tests, executing tests, and test systems and components at the point of fabrication and/or packaging. It would further be advantageous to provide improved means for testing of integrated circuits developed from pre-defined or pre-hardened virtual component blocks.

SUMMARY OF THE INVENTION

The present invention provides, in one aspect, systems and methods for testing integrated circuits.

In a second separate aspect, the present invention is a method of testing an integrated circuit that includes component blocks of random logic in a manufacturing environment. The method preferably includes the steps of performing built-in self tests, at least in part to test memory and data paths of the integrated circuit; performing diagnostics tests, at least in part to test the component blocks of random logic individually; performing stress tests using test vectors, at least in part to test the component blocks of random logic collectively; and performing scan-based tests of the integrated circuit, at least in part to test for structural faults in the integrated circuit.

In a third separate aspect, the present invention is a system for testing an integrated circuit including a memory for storing signatures for initiating built-in self tests, inputs for diagnostic tests, test vectors for stress tests, and scan patterns for scan-based tests. The system preferably further includes a processor for initiating and evaluating performance of the integrated circuit on the built-in self-tests, the diagnostic tests, the stress tests and the scan-based tests.

In a fourth separate aspect, the present invention is a computer-readable medium storing a sequence of instructions for testing a manufactured integrated circuit. The integrated circuit preferably includes a memory, component blocks of random logic and data paths. The sequence of instructions is for performing a set of acts including (a) performing built-in self tests, at least in part to test the memory and datapaths of the integrated circuit; (b) performing diagnostics tests at least in part to test the component blocks of random logic individually; (c) performing stress tests using test vectors at least in part to test the component blocks of random logic collectively; and (d) performing scan-based tests of the integrated circuit at least in part to test for structural faults in the integrated circuit.

In a fifth separate aspect, the present invention is a probe card for testing a device-under-test. The probe card preferably includes a device-under-test interface, a tester interface, and a memory for storing test inputs for the device-under-test. The probe card preferably further includes a data translator connected between the memory and the tester interface for formatting test data communicated between the memory and the tester interface.

In a sixth separate aspect, the present invention is a probe card for testing a device-under-test that preferably includes a device-under-test interface, a tester interface, and an analog signal generator connected between the tester interface and the device-under-test interface. The analog signal generator is preferably configured to receive digital signals representative of analog tests from the tester interface, generate an analog signal based on the digital signals, and transmit the analog signal to the device-under-test interface. The probe card preferably further includes a data translator electrically connected between the device-under-test interface and the tester interface for formatting test data communicated between the device-under-test interface and the tester interface.

In a seventh separate aspect, the present invention is a probe card for testing a device-under-test that preferably includes a device-under-test interface, a tester interface, a fold-back circuit connecting at least two pins of the device-under-test, and a data translator electrically connected between the device-under-test interface and the tester interface. Preferably, the data translator formats test data communicated between the device-under-test interface and the tester interface.

In an eighth separate aspect, the present invention is an integrated circuit that includes circuit component blocks connected via a bus, and I/O pins having corresponding leads connected to the bus. The I/O pins preferably provide a capability for communication external to the integrated circuit. The integrated circuit preferably further includes a fold-back circuit for redirecting a signal transmitted on one of the leads to one of the pins, and fold-back logic for enabling and disabling the fold-back circuit.

In a ninth separate aspect, the present invention is a computer-readable medium storing a sequence of instructions for specifying an integrated circuit. The sequence of instructions is for performing a set of acts including specifying circuit component blocks interconnected via a bus, and specifying I/O pins having leads connected to the bus. The I/O pins preferably provide for a capability for communication external to the integrated circuit. The set of acts preferably further include specifying a fold-back circuit for redirecting a signal transmitted on one of the leads to one of the pins, and specifying fold-back logic for enabling and disabling the fold-back circuit.

In a tenth separate aspect, the present invention is a test station for testing a device-under-test. The test station preferably includes the device-under-test, where the device-under-test includes memory and test logic to lock at least a portion of the memory during a test of the device-under-test. The test station preferably further includes a tester, where the tester is electrically connected to the device-under-test, and is for transmitting digital signals to lock the at least a portion of the memory. The test station preferably further includes a probe card electrically connected to the device-under-test and the tester, where the probe card includes a clock generator for transmitting clock signals to the device-under-test and a data translator electrically connected between the chip interface and the tester interface. Preferably, the data translator formats test data communicated between the chip interface and the tester interface.

In an eleventh separate aspect, the present invention is a method of generating test vectors for testing an integrated circuit at a manufacturing test bench. The method preferably includes steps of obtaining functional level test vectors, converting the test vectors into a series of message blocks, applying an interface protocol to the series of message blocks to generate test vector data, and applying an interface protocol for a device under-test to the test vector data.

In a twelfth separate aspect, the present invention is a system for generating test vectors for testing an integrated circuit at a manufacturing test bench. The system preferably includes a memory for storing functional level test vectors, and a processor connected to the memory for translating the test vectors into message blocks, for applying an interface protocol to the message blocks to generate test vector data, and for applying an interface protocol for a device under test to the test vector data.

In a thirteenth separate aspect, the present invention is a computer-readable medium storing a sequence of instructions for generating test vectors for testing an integrated circuit at a manufacturing test bench. The sequence of instructions is for performing a set of acts including (a) specifying functional level test vectors; (b) translating the test vectors into message blocks; (c) applying an interface protocol to the message blocks to generate test vector data; and (d) applying an interface protocol for the integrated circuit to the test vector data.

In a fourteenth separate aspect, the present invention is a method of generating diagnostic tests for testing an integrated circuit at a manufacturing test bench. The method preferably includes steps of obtaining functional level diagnostic tests for virtual component blocks of an integrated circuit design, translating the diagnostic tests into timing accurate diagnostic tests, converting the timing accurate diagnostic tests into memory load instructions, and applying an interface protocol for a device under test to the memory load instructions.

In a fifteenth separate aspect, the present invention is a computer-readable medium storing a sequence of instructions for specifying and testing a manufactured integrated circuit. The sequence of instructions is for performing a set of acts including (a) specifying virtual component blocks; (b) specifying interconnections between the virtual component blocks; (c) specifying sets of diagnostic tests for testing manufactured forms of the virtual component blocks, where each set of diagnostic tests corresponds to one of the virtual component blocks; and (d) specifying a set of test vectors for testing the manufactured integrated circuit.

In a sixteenth separate aspect, the present invention is a computer-readable medium storing a sequence of instructions for generating and/or translating tests vectors for testing an integrated circuit at a manufacturing test bench. The sequence of instructions is for performing a set of acts including (a) specifying functional level test vectors for testing a functional specification of the integrated circuit; (b) translating the test vectors into message blocks; (c) applying an interface protocol to the message blocks to generate test vector data; (d) applying an interface protocol of the integrated circuit to the test vector data.

In a seventeenth separate aspect, the present invention is a method of manufacturing a computer readable medium storing a design for an integrated circuit and a collection of test inputs for manufacturing and functionally testing a manufactured form of the integrated circuit. The method preferably includes the steps of (a) designing virtual component blocks to be used in the design of the integrated circuit, (b) designing a diagnostic test specific to each virtual component block, (c) determining the design for the integrated circuit comprising the virtual component blocks, (d) obtaining high level test vectors for the integrated circuit, (e) verifying the integrated circuit using the test vectors and the diagnostic tests, (f) augmenting the diagnostic tests and the test vectors for a manufacturing environment, and (g) packaging the design for the integrated circuit with the augmented test vectors.

BRIEF DESCRIPTION OF THE DRAWINGS

FIG. 7 is a diagram of a set of steps for configuring a test bench to advantageously execute test vectors and diagnostics tests that are augmented to the manufacturing environment.

FIG. 10 is a diagram of a physical layout for a probe card and interfaces to a DUT and tester.

FIG. 11 is a diagram of a process flow for preferred order of tests in a chip fabrication testing process.

DETAILED DESCRIPTION OF PREFERRED EMBODIMENTS

Preferred embodiments will now be described, with reference as necessary to the accompanying drawings. First, however, additional general background information is provided concerning electronic design automation (EDA) software tools.

As generally explained previously in the Background section hereof, chip designers generally use a top-down design methodology, starting with hardware description languages (HDLs), such as Verilog® or VHDL, for example, to create an integrated circuit by hierarchically defining functional components of the circuit, and then decomposing each component into smaller and smaller components. The components used in integrated circuits can be characterized as either functional or communication components or blocks.

From the HDL or other high level description, the actual logic cell implementation is typically determined by logic synthesis, which converts the functional description of the block into a specific circuit implementation of the block. The circuit implementation typically exists as a netlist, comprising logic cells or component blocks and including one or more communication blocks. The component blocks are then placed and routed, resulting in a physical layout file. The physical layout file is generally used as a design "blueprint" for fabrication of the integrated circuit. At each stage of the design process, as well as at the fabrication stage, various tests may be run to ensure correct operability of the circuit design.

Figure 1:
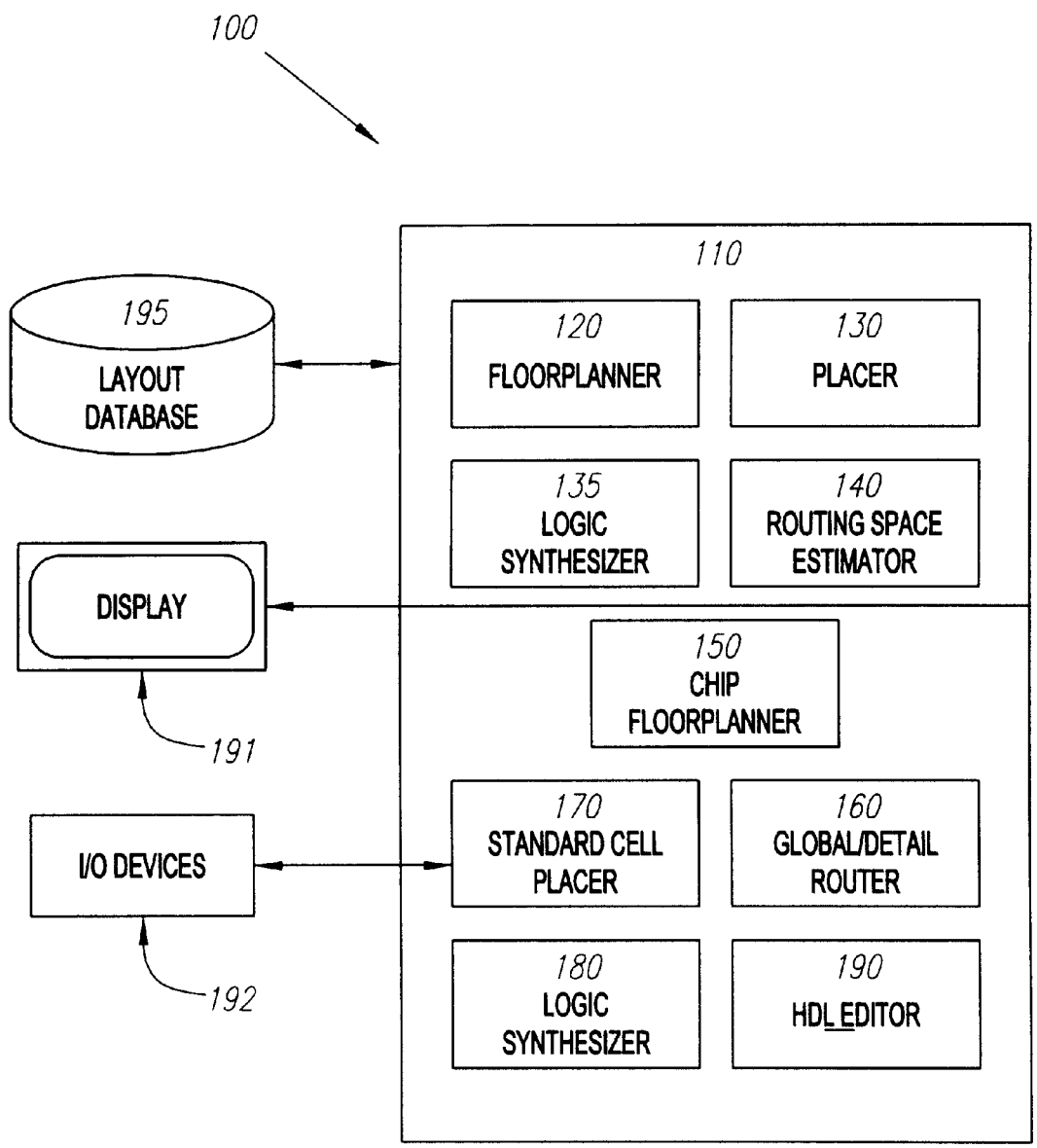
FIG. 1 is a diagram of a computer system that may be used in connection with various embodiments of the invention as described herein.

FIG. 1 is a diagram of a computer system 100 that may be used in connection with various embodiments of the invention as described herein. As shown in FIG. 1, the computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system 100. The computer 110 may comprise, for example, a SPARC™ workstation commercially available from Sun Microsystems, Inc. of Santa Clara, Calif., or any other suitable computer.

As used above, the term "processor" is preferably a general purpose processor configured to execute software (versus a completely hard-wired processor), due to the utility and flexibility in programming the processor and potentially, modifying or substituting the software. Generally, however, in its use throughout, the term "processor" refers to any form of processor or processors that may perform the various electronic functions as described herein. Thus, the term "processor" refers to a wide variety of computational devices or means including, for example, using multiple processors that perform different processing tasks or have the same tasks distributed between processors. The processor(s) may be general purpose CPUs or special purpose processors such as are often conventionally used in signal processing systems. Further, multiple processors may be implemented in a server-client or other network configuration, as a pipeline array or series of processors, etc. Further, some or all of the processing is alternatively implemented with customized and/or hard-wired circuitry such as an application-specific integrated circuit (ASIC), a field programmable gate array (FPGA) or other logic device.

In conjunction with the term "processor," the term "memory" as used throughout refers to any storage medium that is accessible to a processor that meets the memory storage needs for a system or system component for facilitating the various electronically performed functions described herein. Preferably, the memory includes a random access memory (RAM) that is directly accessed by the processor. Optionally, memory may be in the form of a hard disk or other non-volatile memory device or component for storing data, software, and/or other forms of electronically represented information.

Referring again to FIG. 1, the computer 110 contains stored program code including, in one embodiment, a block floorplanner 120, a block placer 130, a logic synthesizer 135 and a routing space estimator 140. The block floorplanner 120 provides for the definition of block functions, block regions, and constraints on these for the purpose of interactive floorplanning operations by the circuit designer, and the control of placement operations of the block placer 130. The block placer 130 determines the placement of cells within blocks according to the constraints defined by the circuit designer. The routing space estimator 140 estimates routing space required for routing the blocks, given the placement of such blocks by the block placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using any convenient database standard such as EDIF, LEF or DEF. The computer 110 may also comprise or be connected to mass storage containing one or more component libraries (not shown) specifying features of electrical components available for use in circuit designs.

Figure 2:
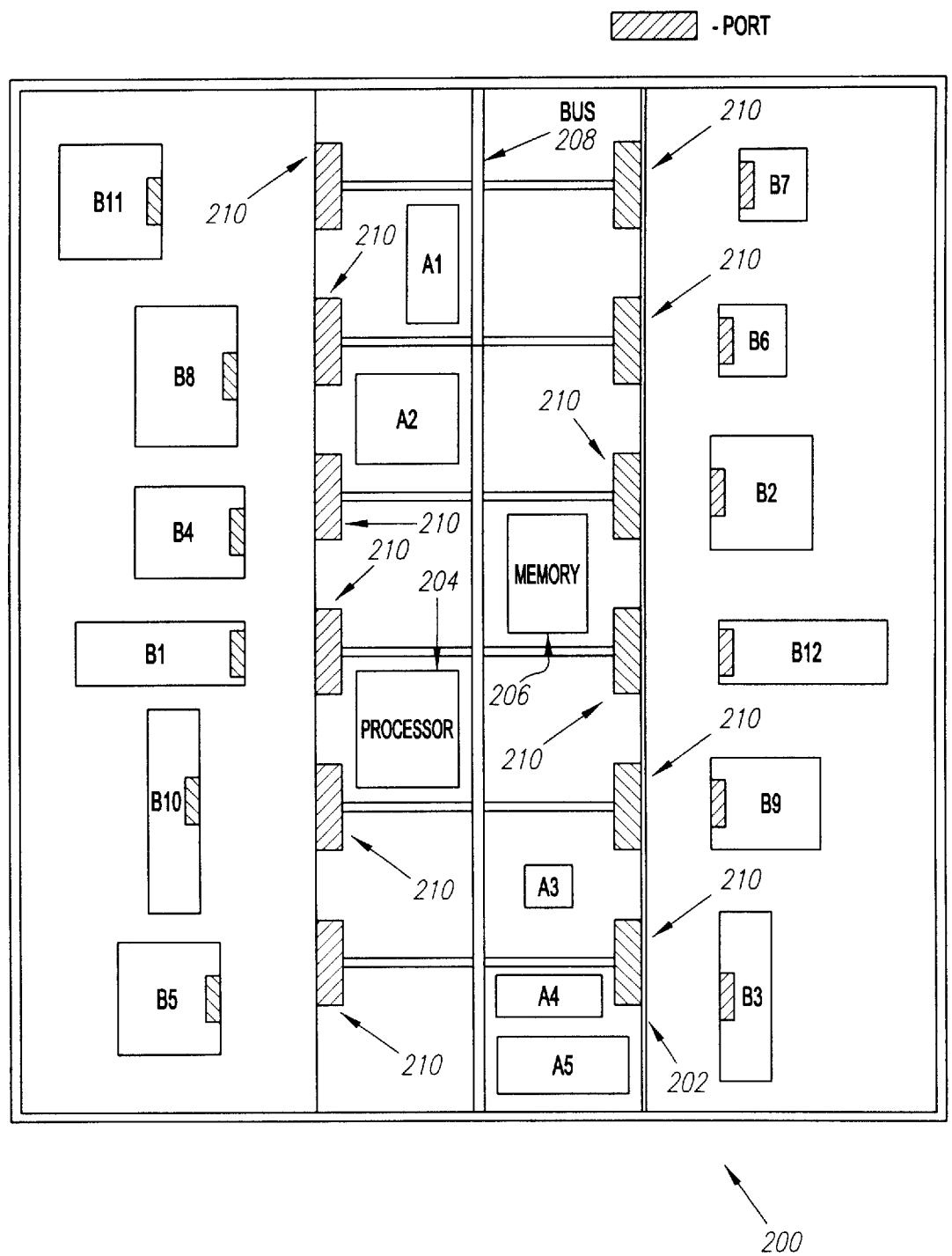
FIG. 2 is a diagram of a simplified integrated circuit as may be generated using a computer system such as shown in FIG. 1, after the component blocks have been placed on the integrated circuit chip.

Referring now to FIG. 2, there is shown a block illustration of an example of a simplified IC 200, wherein a foundation block 202 and a number of peripheral component blocks B1, . . . , B12 have been specified, and their locations on the integrated circuit 200 and the connections between them have been determined. In actual, more realistic integrated circuit designs, the integrated circuit 200 likely would be far more complicated. However, FIG. 2 is useful for purposes of illustration. The foundation block 202 preferably includes a processor 204, a memory 206, several other component blocks, A1, . . . A5, and a communication block comprising a bus 208 and twelve ports 210. The ports 210 are preferably androgynous in that each may be configured as a target or an initiator in the communications interface after the layout of the integrated circuit 200 has been finalized. The foundation block 202, including its components (the processor 204, the memory 206, and components, A1 through A5), and the other peripheral component blocks are preferably fully characterized in the layout database 195. Preferably, the placement of the blocks is in a manner that is optimal with respect to location and the lengths of the connections to the ports on the foundation block 202.

Figure 3:
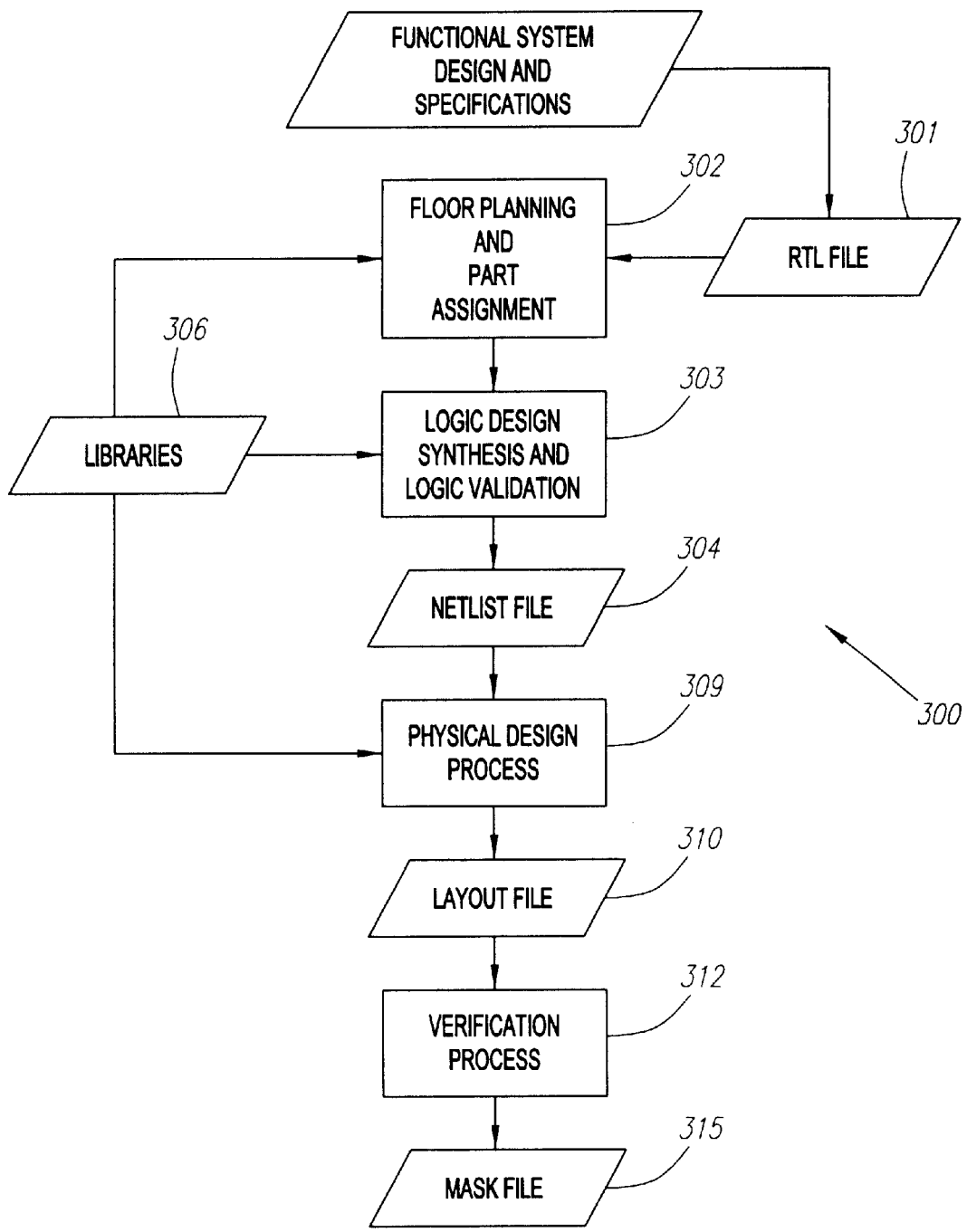
FIG. 3 is a diagram of a general process flow for a circuit design, illustrating various levels of circuit abstraction.

FIG. 3 is a diagram of a general process flow 300 for a block-based circuit design, illustrating some of the various levels of integrated circuit design abstraction as described above. As illustrated in FIG. 3, a register transfer logic (RTL) file 301 in the form of an HDL file or other high level functional description undergoes a specification (floor planning and part assignment) process 302. In this process 302, component blocks are identified from a component library 306 to perform specific functions set out in the RTL file 301. The component blocks are preferably predefined, and although one or more may be based on a customized design not stored or only recently stored within the library 306.

In the next step 303, a form of logic synthesis performed, where in one preferred embodiment, the functional description of the connections between the components is converted into a specific connection implementation which may be stored in the form of a netlist file 304. As part of this compile process 303, the component library 306 is generally referenced, which stores information concerning the communication interfaces, and the characteristics of the components which are needed in order to determine their functional connectivity. The netlist file 304, as previously noted, generally identifies the component blocks from the library 306, and describes the specific component-to-component connectivity.

By application of a physical design process 309 shown in FIG. 3, the component blocks of the netlist file 304 are then placed and routed, resulting in a layout file 310. The component library 306 is utilized in this process stage in order to obtain information concerning the sizes of the components that may be present in the netlist file 304. Previously, this information includes interface specifications, such as the numbers and locations of the interfaces, whether each interface is a target or initiator, and the number of pins and their signal assignments. As described in the background section above, the placement and routing operation is then performed and may be automated in a manner to optimize the integrated circuit's ultimate performance by minimizing connection lengths and the integrated circuit's overall footprint. This placement and routing process however, adheres to the interface specifications obtained from the component library 306.

From the layout file 310, a verification process 312 may be executed, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

In one aspect, systems and methods are provided in connection with certain embodiments disclosed herein for testing circuit designs, particularly those circuit designs incorporating virtual component blocks, and which have been reduced to silicon as part of a semiconductor fabrication process.

In one embodiment, a database of virtual component blocks is provided together with pre-developed diagnostics tailored specifically to the architecture of the virtual component blocks, so that the virtual component blocks and the associated diagnostics may be readily re-used and recycled in a variety of different circuit designs.

Figure 4:
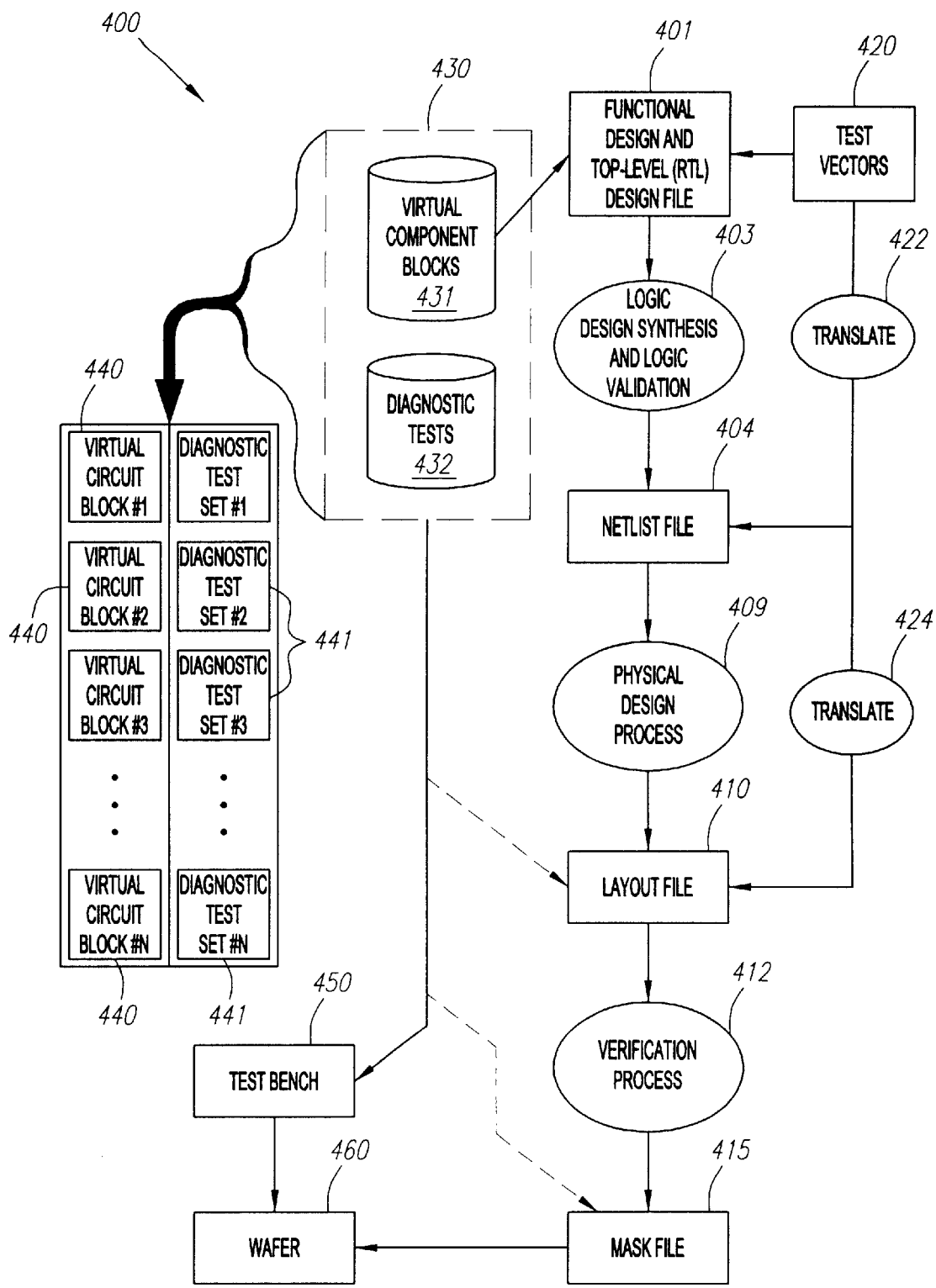
FIG. 4 is a diagram of a virtual component block and diagnostic test information management system, illustrating the application of virtual component block information (including test and diagnostic information) at various stages in an electronic design automation process.

FIG. 4 is a diagram of a design and verification management system 400, illustrating application of virtual component block information (including test and diagnostic information) at various stages in an electronic design automation process. In one aspect, FIG. 4 depicts an electronic design automation process flow similar to that of FIG. 3. Thus, for example, FIG. 4 shows a functional design and/or register transfer logic (RTL) file 401, which may be in the form of a hardware description language (HDL) file or other high level functional description. Similar to the process flow shown in FIG. 3, the functional design file 401 undergoes a compile process 403, which converts the functional description of the circuit into a specific circuit implementation which may be stored in the form of a netlist file 404. A physical design process 409 causes the logic cells of the netlist file 404 to be placed and routed, resulting in a layout file 410. From the layout file 410, a verification process 412 may be run, resulting in a mask file 415, which may be represented in, for example, a GDSII or CIF format. The mask file 415 may be provided to a foundry, resulting in the generation of a semiconductor wafer 460.

To test the circuit design during the different design stages, test vectors 420 may be generated according to any conventional methods. The test vectors 420 may be applied to test the functionality of the functional design file 401. The same test vectors 420, if appropriately translated 422, 424, may also be used to test the netlist file 404 and/or the layout file 410.

In a preferred embodiment, a database 430 is provided for storing virtual component block data 431, in the form of a plurality of virtual component blocks 440, and for storing diagnostic data 432, in the form of diagnostic test input sets 441. Each diagnostic test set 441 is tailored to the particular architecture of a specific virtual component block 440. A diagnostic test set 441 is therefore associated with a specific virtual component block 440. This aspect is represented in FIG. 4 by virtual component blocks 1 ... N in the database 430, alongside diagnostic test sets 1 ... N in the database 430. Each time a particular virtual component block 440 is used in a design, the same diagnostic test set 441 associated with the virtual component block 440 preferably may be utilized, because preferably it has been specifically prepared for the architecture of the virtual component block 440. Optionally, multiple diagnostic test sets 441 may be provided for a given virtual component block 440.

Virtual component blocks 440 are a resource for the design of large-scale circuits. Virtual component blocks 440 may be partially pre-hardened and (from a logical and functional standpoint) pre-tested and pre-verified. Generally, as much internal circuitry of the virtual component blocks 440 as possible will be pre-hardened, while the outside connections (e.g., pin locations) may be "soft" or configurable after generation of the virtual component block 440. Virtual component blocks 440 may be drawn out of the database 430 and incorporated into a functional design file 401 (or even a lower-level file). Because virtual component blocks 440 are largely pre-hardened, their internal circuitry need not be synthesized or validated, nor placed or routed. Rather, the virtual component block 440 as a whole is preferably placed in the overall circuit design, and connected to other components of the design.

As part of the design process, facilities are preferably provided for testing the design at the verification stage, and later, after fabrication of the semiconductor wafer 460 and/or packaging of the integrated circuit. Specifically, scan logic for the performance of scan-based tests is incorporated into the design, preferably at the netlist level. Thus, at this level of the design, scan patterns that correspond to the reduced mask file 415 are generated for use in the manufacturing stage. Similarly, logic is incorporated into the design of the integrated circuit (IC) to enable the execution of built-in-self tests (BISTs). These tests are performed by the fabricated IC itself when a certain test signature is provided to the device.

Thus, in one aspect, the mask file for the IC and test inputs from the design and verification phase are prepared as a package (e.g., an electronic file for storage and/or communication) for the foundry to initiate the fabrication process. In one embodiment, the test inputs comprise sets of diagnostic test inputs and test vectors that have been adapted to the manufacturing environment, and preferably sets of scan patterns and input signatures for initiating the BISTs. For example, the test inputs (i.e., diagnostic test, stress test, scan-based test and BIST inputs) may be adapted to a testbench 450 that is particular to a foundry's manufacturing and testing operations. Such test inputs are preferably included as part of a computer-readable package of intellectual property that includes the mask file for the IC that is provided to the foundry.

In one embodiment, the diagnostic test inputs and test vectors are input directly into the manufacturing testbench 450 and are translated by the testbench 450 for application on the device-under-test (DUT). For example, a test translator in the testbench 450 (i.e., test translation function) may include a processor (e.g., general purpose processor) executing software, where the software is preferably also provided in the package of intellectual property that translates the test inputs before being input to the DUT. Alternatively, the translated diagnostic tests and test vectors are provided in the package of intellectual property that is provided to the foundry such that the equivalent test translator in the testbench 450 is unnecessary.

Figure 5:
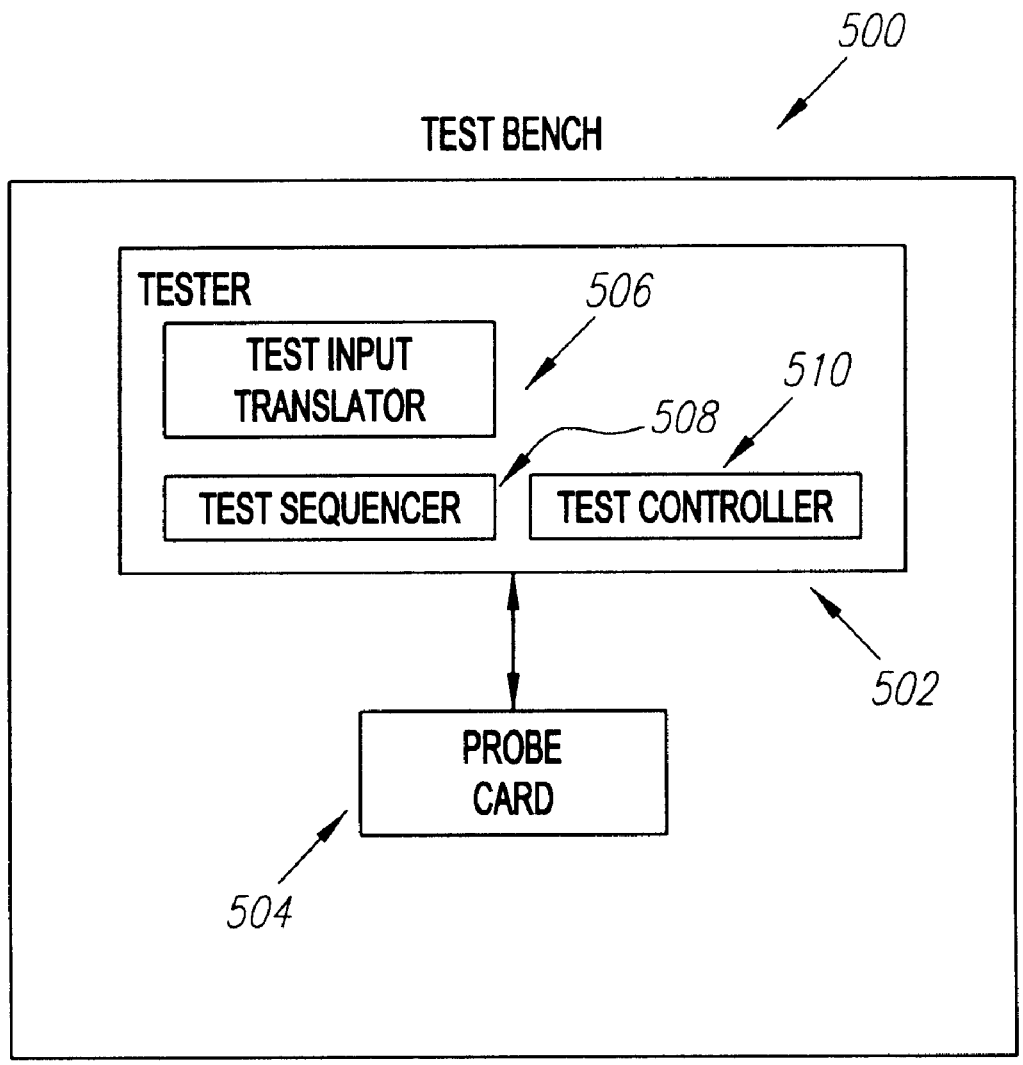
FIG. 5 is a block diagram of one embodiment of a testbench as represented generally in FIG. 4.

FIG. 5 depicts a preferred embodiment of a testbench 500 for robust testing of complex integrated circuits, whether configured on wafers or packaged, while being practicable in terms of test time and test cost per wafer (or package). The testbench 500 preferably includes a tester 502 and a probe card 504 on which is placed individual IC wafers for testing. The probe card 504 preferably is customized to the design of the IC and includes multiple components to enable at-speed testing of the DUTs without requiring high bandwidth communication with the tester 502.

The testbench 500 is preferably generally designed to achieve a number of objectives beyond the conventional manufacturing testing function. First, the testbench 500 uses the test inputs that have been previously generated to complete the verification phase for the IC. Second, the testbench 500 is configured to have processing-intensive testing operations preferably performed on the DUT itself, secondarily on the probe card 504, and lastly on tester 502, and in a manner such that the I/O between the tester 502 and the probe card 504 is minimized. Third, the testbench 500 configures the ordering of tests to minimize the average testing time per DUT. Preferably, the ordering of tests is customized for each IC design.

In one embodiment, the tester 502 preferably includes a test controller 510, a test input translator 506, and a test sequencer 508. The test controller 510 preferably controls overall testing operations and preferably includes general testing instructions for the probe card 504. The test-input translator 506 may translate test vectors and diagnostic tests from the verification phase of IC development for application in the manufacturing test environment. Optionally, the translation is performed on the probe card 504 (see the data translator 1004 of FIG. 10 and discussed hereafter) or elsewhere on the testbench 500. As discussed above, in the verification phase of a detailed design for an integrated circuit, diagnostic tests are preferably generated to verify the performance of each of the virtual component blocks in the virtual integrated circuit. Furthermore, the test vectors, having varying levels of refinement, are preferably generated to test the performance of the virtual IC as a whole.

The test sequencer 508 preferably controls the ordering of the tests that are performed for a particular IC design. Preferably, the test sequencer 508 orders tests to minimize overall test time per DUT. The test sequencer 508 may be implemented in software on a general or special purpose processor, fully implemented in hardware or as a combination of hardware and software. Optionally, the functionality of the test sequencer 508 is included in the preferably computer-readable package of intellectual property (i.e. the mask file, probe card 504, and test inputs) that is provided to the foundry.

Figure 6A:
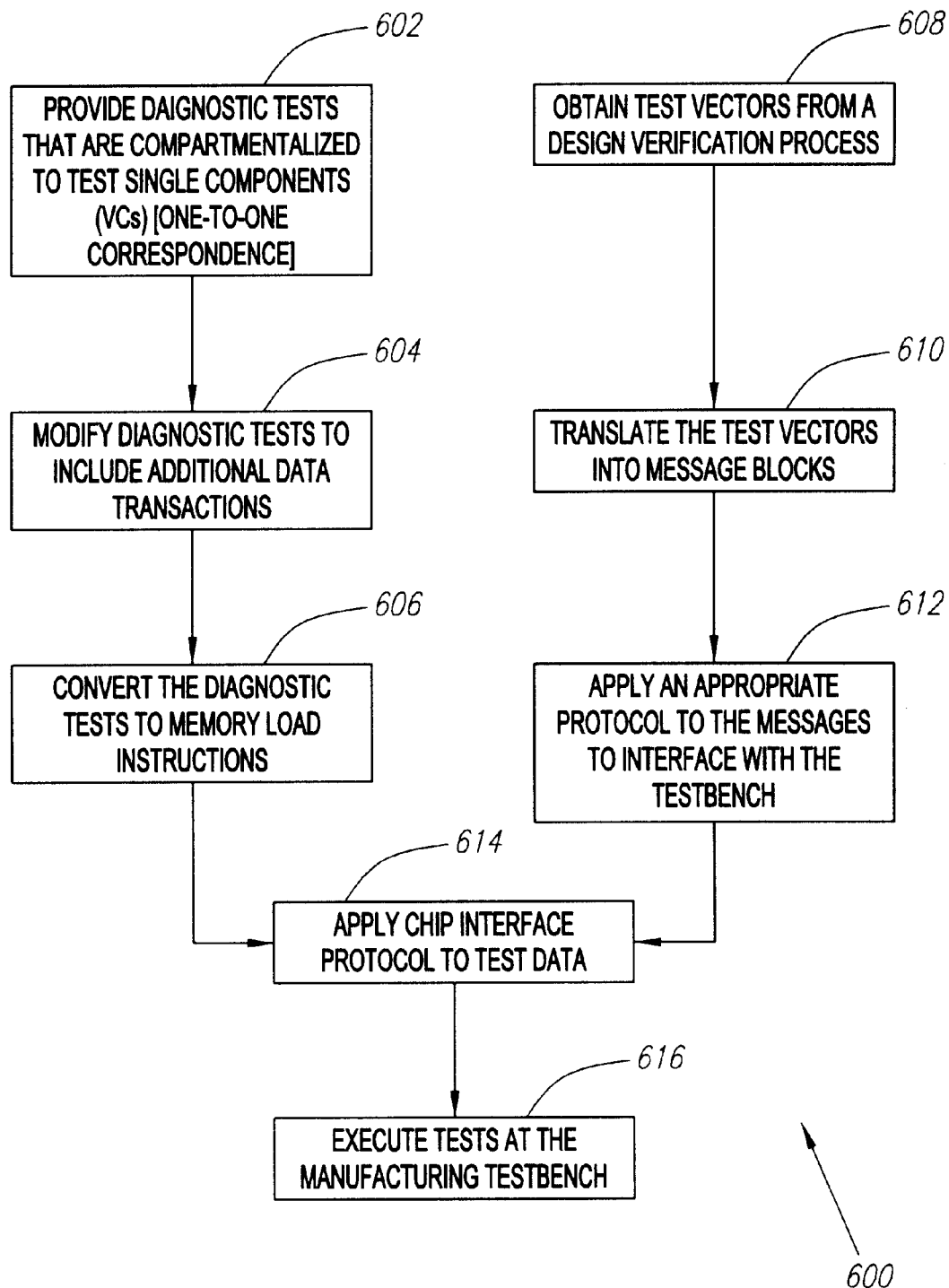
FIG. 6A is a diagram of a process flow for translating tests from a design verification phase to a manufacturing phase in which individual fabricated ICs are tested.

FIG. 6A depicts a preferred method 600 for translating the test vectors and diagnostic tests that are derived for a verification phase of an IC design to a manufacturing phase in which fabricated ICs are individually tested. Optionally, a test-input translator, such as that described above and shown in FIG. 5, performs the translation process and includes software, hardware or any convenient combination of the two to implement the test input translation method 600. In translating the verification tests, with regard to the diagnostics tests for testing individual component blocks, in a first step 602, the diagnostics tests designed for testing a set of virtual components are provided. Preferably, a group of diagnostics tests may be broken down into sets of tests each corresponding to a particular virtual component block that is physically represented on the IC. Each set of diagnostic tests preferably tests only one component block and generally tests no parts of other component blocks. Furthermore, each set of diagnostic tests preferably requires little or no use of other component blocks to complete the test of its corresponding component block.

Once the diagnostics tests having component independence for testing are provided, a next step 604 is preferably to obtain the diagnostic tests that enable data transactions with respect to a specific architecture. In particular, the diagnostic tests from step 602 may be specific to a particular function but not a particular architecture for the function. In one embodiment, diagnostic tests for the architecture chosen to perform the given function may be available, in which case the diagnostic tests for that component may be retrieved. Alternatively, the diagnostic tests at the functional level are refined for the new architecture. For example, a functional-level diagnostic test may be in the form of a C-code routine that iterates through the function. To refine the diagnostic test to the architecture-specific level, the C-code routine may be converted to an assembly code description (i.e., from mnemonics to binary instructions). At this level, the diagnostic tests may be used to verify the function of the component block and the bit failures in the physical blocks as is required for manufacturing test.

In a next step 606, the diagnostics tests are preferably converted to memory load instructions for the manufacturing testbench. The specific form of the memory load instructions first depends on whether it is desired to execute the tests from the tester, the probe card, or the device-under-test (DUT) at the testbench. Preferably, the tests are executed from the DUT, or if that is not feasible or advantageous, from the probe card. Once determined, the diagnostic tests are fixed to a particular set of addresses in a cache or scratchpad memory, based on the size and type of the cache or scratchpad memory. Each diagnostic test thereby is assigned a particular address in the memory, the complete list of assignments then being provided to a diagnostic test scheduler.

In a next step 614, the diagnostic tests are preferably formatted to the interface protocol specified for the blocks physically manifested off the system bus on the DUT. Preferably, this formatting involves wrapping the diagnostic tests with the protocols of the IC's system bus and virtual component interface (VCI) (see the copending application entitled "Circuit Component Interface" and filed on Jan. 18, 2001, which is hereby Ser. No. 09/765,917 incorporated by reference as though fully set forth herein, and which discusses the VSIA Virtual Component Interface Standard (OCB 2 1.0)). Formatting for the VCI protocol simplifies issues with respect to designing interfaces for components. By incorporating the VCI protocol into component design, diagnostic tests may be loaded into cache or other memory with little concern about the particular bus architecture used for the system bus. Furthermore, the protocol preferably allows components to be programmatically set into states as initiators or targets for communication of data.

With respect to test vectors, a first step 608 is to preferably obtain the test vectors devised during the verification phase used to test the design of the virtual IC. The test vectors obtained preferably may be used to perform stress tests on the IC at a high level of specification (typically at a functional level), and may comprise a file of data on a computer readable medium. To translate the test vectors for use in the fabrication environment, in a next step 610, the test vector file is preferably converted or broken into one or more message blocks or packets to facilitate the transmission of the test data into a memory in a fabrication test bench. Each message block may be, for example, a word-wide piece of data that can be transmitted on a bus. The message blocks, in a next step 612, are then preferably formatted with a point-to-point interface protocol, such as the VCI protocol discussed above, based on the types of interfaces employed in the design of the IC. As a final step 616, the appropriately formatted diagnostic tests and test vectors are loaded as separate blocks into the DUT and executed as part of an optimized sequence of tests in a manufacturing testbench process (see FIG. 11).

Figure 6B:
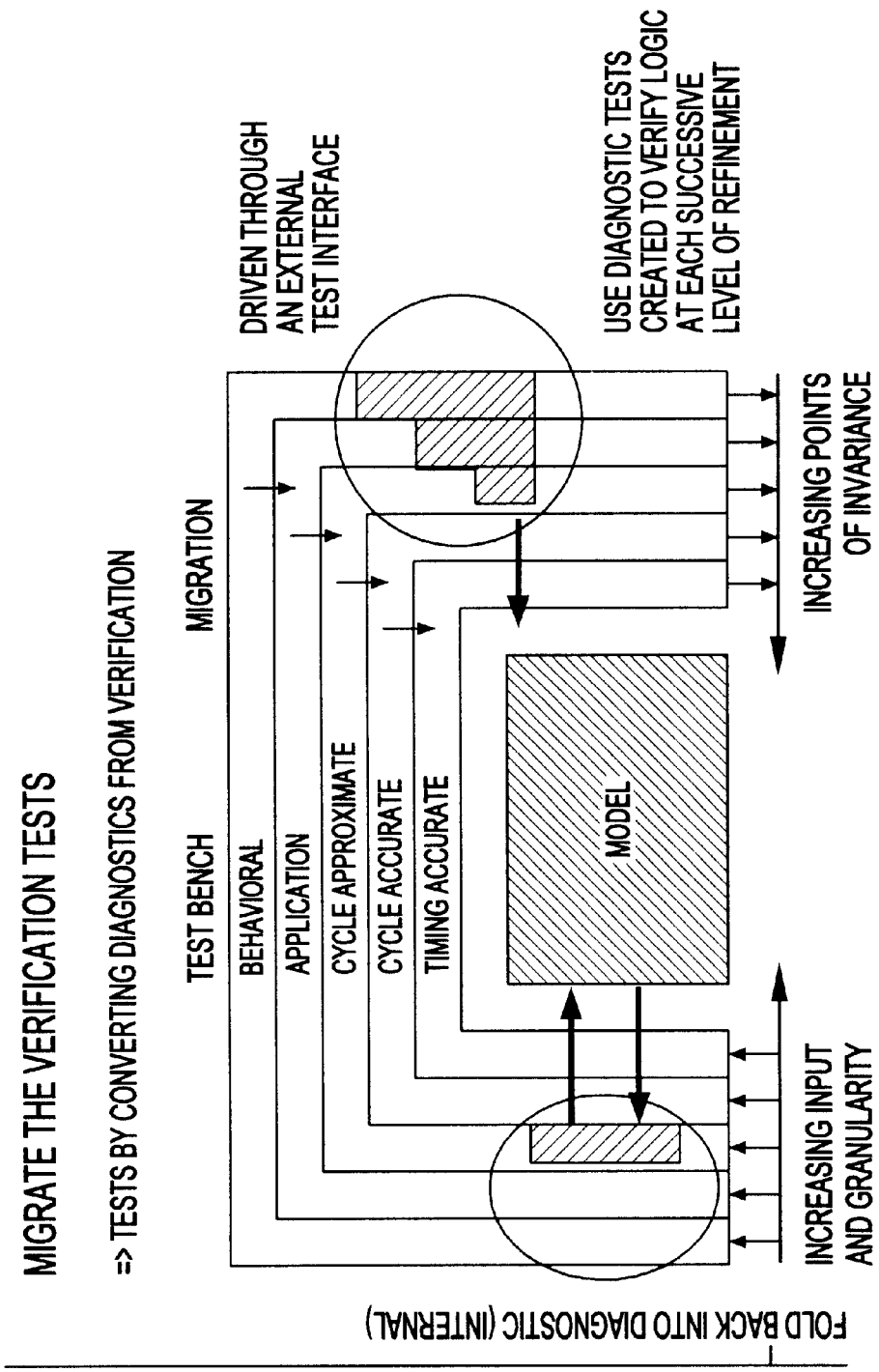
FIG. 6B is an illustration of the migration of verification tests for a virtual IC design to a manufacturing phase for testing actual ICs that manifest the design.

FIG. 6B depicts an illustration of the migration of the tests from the verification phase for the virtual IC design to the manufacturing phase for testing actual ICs that manifest the design. Test vectors in a design verification stage may be characterized by varying levels of refinement. That is, one set of test vectors may apply to a high or functional level of design, while other vectors may apply to more detailed or architecturally specific levels of hardware design. The concept of varying levels of refinement in the test input for a design verification process is preferably then applied to migrate functional test vectors in a verification environment to useful test vectors in a manufacturing test environment. As depicted in FIG. 6B, functional test vectors are increasing refined using software modules developed to refine the functional test vectors into test inputs at the timing accurate level necessary to test a chip. As depicted in FIG. 6B, a similar migration of test data may be performed with respect to diagnostics data design to test virtual component blocks in block-based design process. These diagnostics tests are preferably augmented to test the physical complements to the virtual component blocks in the chips within the manufacturing environment.

FIG. 10 depicts a physical layout for a preferred embodiment of a probe card 1000 and interfaces to a DUT 1002 and a tester 1001. Preferably, the particular implementation of the probe card 1000 is such that it is customized for the particular IC design represented by the DUT 1002. As a customized component, the probe card 1000 may be designed in parallel with or any convenient time after the IC design process. In one embodiment, the package of intellectual property that includes the mask file for the IC and the test inputs that is provided to the foundry also includes the probe card specifically designed for testing the integrated circuits manufactured based on the design in the mask file and for executing the specified test inputs. The foundry preferably specifies the footprint for the probe card (i.e., the size and shape of the card, the location of the probes, and interface to the DUT) and its interface including the set of signals for communicating with the tester. Based on this limited set of information from the foundry, the probe card 1000 is preferably made part of the package of intellectual property provided to the foundry.

The probe card 1000 preferably includes any one or more of the following as needed: a data translator 1004, a memory and control logic 1006, a high-speed clock generator 1008, an analog signal generator 1012, a scan test interface 1010 and a direct tester interface 1014. The connections between the probe card 1000 and the tester 1001 generally comprise a tester interface and the connections between the probe card 1000 and the DUT 1002 generally comprise a DUT interface. The DUT 1002 is preferably positioned to electrically connect to each of the components on the probe card 1000. The components on the probe card 1000 are specifically positioned to enable the performance of at-speed diagnostic tests of component blocks on the DUT 1002 and at-speed stress tests using test vectors.

The data translator 1004 may be implemented as a hard-wired component, an FPGA, a general-purpose processor running software, or another type of processor. The data translator 1004 preferably includes connections to the memory and control logic 1006 and the tester 1001. The data translator 1004 preferably further includes a VCI and chip interface to preferably provide direct access to the system bus on the DUT 1002. The data translator 1004 may format test data from the tester 1001 for the DUT 1002 or the memory and control logic 1006 with protocol and/or preamble information. If implemented as a programmable device, the data translator 1004 may enable the probe card 1000 to be adapted to a variety of different integrated circuit designs, particularly commonly derived designs, such as those that may be based on a common foundation block.

The clock generator 1008 has control connections to the tester 1001 and connections to the DUT 1002 and the memory and control logic 1006. The clock generator 1008 resides on the probe card 1000 to minimize the costs and complications of distributing high-speed clocks from the tester 1001. In part because the DUT 1002 generally does not include a crystal oscillator to drive a clock and potentially because of noise considerations, the clock generator 1008 preferably is positioned on the probe card 1000.

The analog signal generator 1012 includes connections to the tester 1001 and the DUT 1002. Furthermore, the probe card 1000 preferably provides the direct tester interface 1014 for direct tests of the DUT 1002 from the tester 1001. The probe card 1000 also provides the scan test interface 1010 between the tester 1001 and the DUT 1002 to permit scan tests that the tester 1001 directly performs at different logic points inside the DUT 1002.

FIG. 7 depicts a preferred set of features of the test bench to advantageously execute the test vectors and the diagnostics tests that are augmented to the manufacturing environment. The features generally take advantage of the processing and memory capabilities of the DUT and, secondarily, the probe card to complete the tests. For different IC designs, some of the features optionally may not be present as some features may only be advantageous for designs that have certain attributes.

One preferred feature is that the memory on the chip, preferably cache, is lockable to insure that the loaded diagnostic is not removed during its operation. The memory is preferably also specifiable, due to logic and/or memory elements in the memory and/or elsewhere on the chip, as a communication target for external loading of the tests. With this feature, a memory that otherwise is not configured to receive data from an external source can then be used to store tests and effectively become part of the manufacture testing process. Preferably, this parameterization of the memory is performed by having a protocol that allows the memory to be specified as a target for external data. The VCI protocol discussed above preferably provides this functionality. Furthermore, certain cache or other memory may be automatically swapped out unless they are specifically configured as locked to prevent the loss of the test and diagnostic data. By locking certain memory locations, test data that would otherwise be lost is preferably maintained for the duration of the test. Additional details and alternatives on the use of memory, including memory cache, for testing a circuit are disclosed in U.S. Pat. No. 6,003,142 issued to Mori, which is hereby incorporated by reference as though fully set forth herein.

Similarly, as another preferred feature, other blocks internal to the chip are preferably configured with an interface to enable direct addressing from a test port to an external source of data. Preferably, these components also include a virtual component (VC) interface to enable the components to be specified as targets for diagnostic tests. The test port preferably includes a VC interface direct to the system bus on the chip, and preferably specifies itself as a message initiator for communicating test data. From this test port on the device-under-test (DUT), the test vectors (which preferably have been already translated into timing accurate vectors) and the diagnostics tests are written into the specific components (including memories) on the chip, where each component has its own VC interface (or other point-to-point interface) to accept test data.

Figure 8:
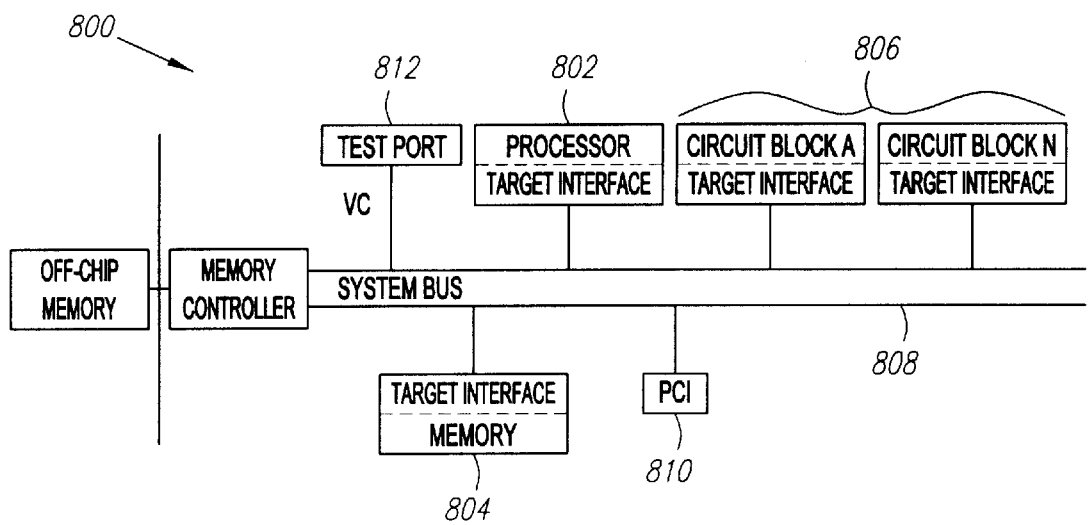
FIG. 8 is a diagram of a physical layout for a chip having interfaces to transmit diagnostic data to circuit blocks to perform specific diagnostics tests, and test vector data to appropriate memory to enable a local execution of at-speed stress tests.

FIG. 8 depicts a physical layout of a chip 800, having interfaces to transmit diagnostics data to appropriate blocks for specific diagnostics tests, and test vector data to appropriate memories to enable local execution of at-speed stress tests. With the VC interface, each component (including a processor 802, a memory 804, and circuit blocks A . . . N 806) off of a system bus 808 may be configured to receive and execute test data. If direct access to a component is required, then a VC interface is preferably included on the component. Alternatively, each component includes an androgynous version of the VC standard interface that enables each component to dynamically switch between being the target side of the interface to the initiator side of the interface, and vice versa. Details of the implementation of the androgynous interface are disclosed in the copending application entitled "Circuit Component Interface" referenced above. Preferably, the chip 800 includes a Peripheral Component Interconnect (PCI) and/or serial input/output (SIO) interface 810 to enable communication between the chip components and peripheral components off of the chip 800. The implementation of a standard interface for each component on the chip 800 and at a test port 812 enables the test vectors and diagnostics to be independent of the system bus 808 that is used.

Figure 9A:
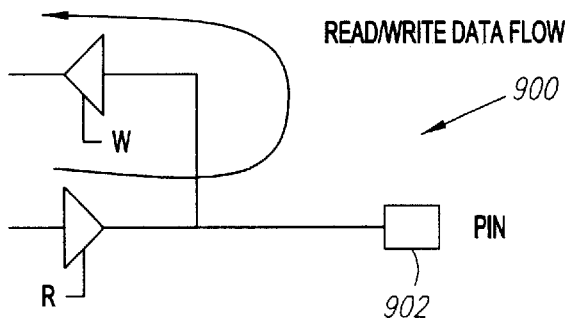
FIG. 9A is a diagram of a preferred implementation of a fold-back scheme such as that generally referenced in FIG. 7, wherein the fold-back scheme resides wholly on the chip under test.
Figure 9B:
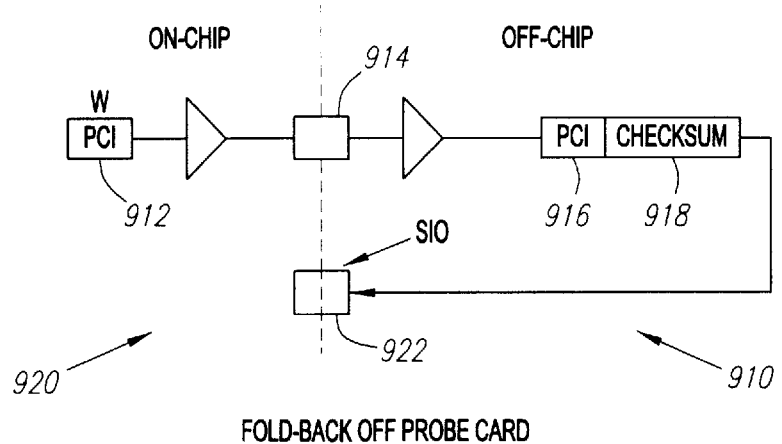
FIG. 9B is a diagram of an alternative embodiment of a fold-back scheme such as that generally referenced in FIG. 7, wherein test data is written out from a PCI interface and then from an I/O pin.

Referring again to FIG. 7, another preferred feature of the at-speed test bench is a fold-back capability at the I/O interfaces of the chip. A fold-back implementation may increase the speed and efficiency of the diagnostic tests and the tests that apply the test vectors. FIGS. 9A and 9B detail two forms of the fold-back scheme, both of which may be used for testing different parts of the IC. Typically, the diagnostic tests and test vectors are not used in the manufacturing process to test the chip on a cycle-by-cycle basis. The results of the test are preferably in the form of a checksum that compares test input with test output. To increase the efficiency of such tests, a fold-back capability enables the simultaneous testing of output lines from the chip and input lines into the chip. FIG. 9A depicts a preferred implementation of a fold-back 900 that resides entirely on the chip without resorting to transmission of the signals off of the chip and onto the probe card 1000. In FIG. 9A, a logical state is provided to enable the simultaneous read and write of the test data at one of the chip's I/O pins 902. In this logic state, a test that, for example, has been loaded into the memory of the DUT, is run by the device, with the processor on the DUT handling the I/O operations. Test data that is read out is folded back into the chip to be read into where a checksum is performed. Such fold-back logic preferably is integrated into the IC's design and is used to enhance the efficiency of testing the IC during manufacturing. Fold-backs may also be built into individual circuit blocks within the DUT to improve the efficiency of testing such blocks. Where the DUT or individual blocks include both analog inputs and outputs, analog signal fold-backs may be designed into the integrated circuit.

FIG. 9B depicts another embodiment of a fold-back 910, wherein test data is written out from a communication interface 912 (e.g., PCI interface) on a chip 920 and then from an I/O pin 914. An off-chip communication interface 916 (e.g., PCI interface) strips out the protocol information and sends the raw test data to a checksum 918. The communication interface 916 then folds the data back into the chip 920. At the end of a test, a checksum (not shown) from the DUT 920 may be compared with the checksum 918 on the probe card 1000, to isolate the location (i.e., input to or output from the DUT) of any fault. Having the checksum 916 on the probe card 1000 avoids having to send the data to the tester. In one embodiment, the fold-back 910 into the chip 920 is via a serial input/output (SIO) pin 922. In another embodiment, the fold-back into the chip, shown in FIG. 9A, also drives an external checksum on the probe card 1000 to isolate the location of any fault. Preferably, the off-chip logic is built into the design of the probe card 1000 and may, for example, be implemented in a data translator, such as is represented in FIG. 10.

Referring again to FIG. 7, additional features may facilitate at-speed testing without requiring the prohibitive costs of high-speed testers. These additional features minimize the bandwidth between the probe card and the tester without compromising the desire for at-speed testing of the DUT. In one embodiment, the probe card preferably includes a significant amount of memory to reduce the bandwidth to the tester (e.g., 500 mbits of RAM). By moving significant memory off of the tester and onto the probe card, certain high-speed data transactions may be performed between the DUT and the probe card with out having to involve the tester. For example, although data is transferred between the probe card and the DUT at high speed relative to the bandwidth between the tester and the probe card, the data is transferred in infrequent bursts. Thus, by including a FIFO on the probe card, data is regularly transferred from the tester to the probe card to maintain data in the FIFO while it is transferred out of the FIFO to the DUT in high-speed bursts. While increasing the memory on the probe card generally increases the cost of the probe card, using as much of the on-chip memory as possible preferably minimizes such costs. Furthermore, any increased memory on the probe card is a relatively small expense when amortized over all of the chips that may be tested.

Another preferred feature of the test bench is that the analog interfaces of the DUT are effectively converted to digital interfaces. This conversion is preferably implemented by including an analog signal generator on the probe card. In a preferred embodiment, rather than having the tester transmit analog test signals to analog interfaces of the DUT, digital codes representing particular analog signals are transmitted from the tester to the probe card. Then, based on the digital signal code from the tester, the probe card generates the appropriate analog signal, and provides that signal as input to the DUT.

Furthermore, the test vectors and diagnostic tests that are migrated from the verification phase and other tests that may be executed (e.g., scan tests) are preferably transmitted in a minimal form from the tester to the probe card to minimize bandwidth overhead between the two components of the testbench. The diagnostic tests, for example, are preferably referenced as a short string that is transmitted to the probe card. The string then preferably executes a processing intensive test that removes any bandwidth limitation caused by the tester. The short string may be in the form of a code for the test vector, which is stored on the probe card. Alternatively, the string may represent an actual diagnostic test that is used to perform time-consuming tests, and then is optionally automatically modified by the probe card to generate additional diagnostic tests. With respect to the test vectors, the tester may be configured to transmit only the critical functional information regarding a set of test vectors, and provide logic on the probe card to generate the appropriate control signals that would be applied to the DUT to execute the test. Optionally, scan-based tests may also be generated on the probe card based on a scan pattern identifier provided by the tester.

Another preferred feature is the use of separate power supplies for the probe card and the DUT to protect the DUT. By having separate power supplies, a DUT can be powered up without having to cycle the probe card's power supply for each DUT. Furthermore, by maintaining separate sources, tests relating to the powering the DUT can be more readily performed. For example, by using separate power supplies for the probe card and the DUT, a check of the DUT's electric current may be performed when power is applied from its power separate supply.

Yet another preferred feature of the testbench is that direct interfaces are provided between the tester and the pins of the DUT. By including these interfaces, analog checks of the DUT, such as the drive strength and voltage levels of the drivers of the pins, may be performed.

Preferred methods of testing IC are provided which use the test vectors and diagnostic tests migrated from the design verification phase to the manufacturing phase. The preferred testing methods achieve the objectives of robust, yet cost effective manufacturing phase testing. In the methods, at least four types of tests are preferably executed including the diagnostic tests and stress tests, built-in self tests (BISTs), and scan tests to perform a complete and robust testing of a DUT. The BISTs generally are effective at testing memories and datapaths including their timing and stuck-at faults, achieving the conventionally required fault checking performance of about 99.9%. The BISTs, however, are generally not as effective at testing random logic, including control functions. To test these other areas of the IC, the diagnostic tests, stress tests and scan-based tests are applied. The diagnostic tests are executed, preferably at-speed, to check the individual circuit blocks for which they are designed. The stress tests, which preferably run the migrated test vectors at-speed, provide test snapshots of the overall system. The stress tests typically test the functionality of the components at a system level, at the operational performance limits of the IC. These two tests, however, do not generally achieve the conventional requirement of about 99.9% structural fault testing. To reach this level of testing performance, scan-based tests are preferably executed to complete the testing process.

FIG. 11 depicts one preferred process flow in terms of a preferred order of test execution in a chip fabrication testing process 1100. The order of process steps is preferably guided by a desire to perform the quickest and least expensive tests first to determine if a fault in a particular chip exists, and to save the time consuming and expensive tests until the end of the testing process 1100. The testing process 1100 depicted in FIG. 11 is preferably ordered based on an emphasis towards identifying the location of the fault (versus merely determining that a fault exists), which may be a priority, for example, if the manufacturing tests are performed at a prototype debug stage. Thus, one protocol for determining the order of tests is that tests that may assume the previous verification of particular components are not performed until the particular components have been verified by other tests. In one embodiment, a test sequencer, such as that discussed above and represented in FIG. 5 controls the ordering of tests based on the fault detection and/or identification priorities.

As a first preferred test 1102 in the process 1100, the built-in self-tests (BISTs) are preferably performed first. Then, in a second step 1104, the at-speed diagnostic tests are preferably performed to verify the performance of the individual component blocks on the chip. As a next step 1106, the at-speed stress tests using the test vectors are applied to the chip. Because these tests generally test the overall system, they assume the validation of the individual components. Thus, these tests are preferably performed after the diagnostic tests and BISTs. Then, in a next step 1108, scan-based testing of the DUT from the tester is performed, where scan patterns may be generated using existing software tools (e.g., Automatic Test Pattern Generation (ATPG) software). The scan-based tests are normally the most time-consuming and expensive of the tests at the manufacturing testbench, and are therefore preferably performed as a final or close-to-final test. Because the diagnostic tests and the stress tests test for the vast majority of the faults, many fewer scan patterns may be executed than would otherwise be required for the necessary 99.9% verification.

Alternatively, the first two steps 1102, 1104 may be reversed in order depending on the relative costs of the tests. As another alternative, steps 1104 and 1106 may be reversed in order. In the manufacturing-for-production context, where the tested ICs are subsequently incorporated into electronics products and/or are provided to customers (i.e., "out into the field"), fault detection rather than fault identification is generally the higher priority. Thus, test ordering is preferably driven by the desire to identify faulty ICs quickly, so that they can be discarded and testing can continue on potentially good ICs. The stress tests, which test the overall system and thereby test larger areas of IC "real estate" than diagnostic tests, may be more likely to identify faults more quickly than the diagnostic tests. Thus, in the manufacturing-for-production context, stress tests are preferably performed before the diagnostic tests, and optionally before the BISTs.

In another embodiment, analog tests are incorporated into the test ordering method. Typically, analog tests are slower than digital tests because analog tests are subject to the natural settling time of analog devices. However, they generally are not as time-consuming and expensive as scan-based tests. Thus, preferably, for ICs that may have a relatively small analog portion, the analog tests are preferably performed after the functional tests are executed (i.e., diagnostic tests step 1104 and stress tests step 1106), but before the scan-based tests 1108 are run. Alternatively, for ICs where analog devices are predominant, the analog tests are preferably performed as a first testing step, particularly in a manufacturing-for-production context where early fault detection may be the highest priority and analog tests test the largest areas of the IC.

In yet another embodiment, the performance of scan-based tests is partitioned into preferably two separate steps. Where block-level scan patterns have been generated at the design verification phase, such block-level scan tests are preferably performed after diagnostic tests at the block level have been executed. This preference is particularly applicable in the prototype debug context where fault location identification may be the highest priority rather than early fault detection. In this case, executing inter-block scan patterns preferably comprises the performance of the scan-based test 1108 as a final or close-to-final testing step. In other embodiments, the sequence of tests may be varied to achieve an overall objective of minimizing the test cost per DUT.

Further information about preferred test and verification methodologies and systems is described in the accompanying materials. Additional information relating to various aspects of virtual component blocks may be found in copending U.S. Provisional Patent Application Serial No. 60/176,879 filed on Jan. 18, 2000, hereby incorporated by reference as if set forth fully herein.

While preferred embodiments of the invention have been described herein, and are further explained in the accompanying materials, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method of testing an integrated circuit comprising component blocks of random logic in a manufacturing environment comprising the steps of:
    (a) performing built-in self tests, at least in part to test memory and data paths of the integrated circuit;
    (b) performing diagnostics tests, at least in part to test the component blocks of random logic individually;
    (c) performing stress tests using test vectors, at least in part to test the component blocks of random logic collectively; and
    (d) performing scan-based tests of the integrated circuit, at least in part to test for structural faults in the integrated circuit.

2. The method of claim 1, further comprising the step of performing analog tests of analog portions of the integrated circuit.

3. The method of claim 1, wherein the integrated circuit is a prototype and the steps are performed in the order of step (a), then step (b), then step (c), and then step (d).

4. The method of claim 3, wherein the integrated circuit includes an analog portion and a digital portion, the digital portion being substantially larger than the analog portion and the method further comprising a step performed between steps (c) and (d) of performing analog tests of the analog portion of the integrated circuit.

5. The method of claim 3, wherein the integrated circuit includes an analog portion and a digital portion, the analog portion being substantially larger than the digital portion and the method further comprising a step performed before step (a) of performing analog tests of the analog portion of the integrated circuit.

6. The method of claim 1, wherein the integrated circuit is one in a production of integrated circuits for field use, and the steps are performed in the order of step (c), then step (a), then step (b), and then step (d).

7. The method of claim 6, wherein the integrated circuit includes an analog portion and a digital portion, the digital portion being substantially larger than the analog portion, and the method further comprising a step between steps (b) and (d) of performing analog tests of the analog portion of the integrated circuit.

8. The method of claim 6, wherein the integrated circuit includes an analog portion and a digital portion, the analog portion being substantially larger than the digital portion, and the method further comprising a step before step (c) of performing analog tests of the analog portion of the integrated circuit.

9. A system for testing an integrated circuit comprising:
   a. a memory for storing signatures for initiating built-in self tests, inputs for diagnostic tests, test vectors for stress tests, and scan patterns for scan-based tests; and
   b. a processor for initiating and evaluating performance of the integrated circuit on the built-in self tests, the diagnostic tests, the stress tests and the scan-based tests.

10. The system of claim 9, the processor configured to sequence the tests of the integrated circuit based on the relative priorities of early fault detection versus early fault identification.

11. The system of claim 10, wherein the priority of early fault identification exceeds the priority of early fault detection and the processor is configured to sequence the tests in an order of built-in self tests, diagnostic tests, stress tests and then scan-based tests.

12. The system of claim 10, wherein the priority of early fault detection exceeds the priority of early fault identification and the processor is configured to sequence the tests in an order of stress tests, built-in self tests, diagnostic tests, and then scan-based tests.

13. The system of claim 9, wherein the memory further stores analog tests for testing analog components of the integrated circuit, and the processor is configured to initiate and evaluate the performance of integrated circuit on the analog tests.

14. A computer-readable medium having stored therein one or more sequence of instructions for testing a manufactured integrated circuit, said integrated circuit comprising memory, component blocks of random logic and datapaths, said one or more sequences of instructions causing one or more processors to perform a plurality of acts, said acts comprising:
   (a) performing built-in self tests, at least in part to test the memory and datapaths of the integrated circuit;
   (b) performing diagnostics tests at least in part to test the component blocks of random logic individually;
   (c) performing stress tests using test vectors at least in part to test the component blocks of random logic collectively; and
   (d) performing scan-based tests of the integrated circuit at least in part to test for structural faults in the integrated circuit.

15. The computer-readable medium of claim 14, said acts further comprising performing an analog test of an analog portion of the integrated circuit.

16. The computer-readable medium of claim 14, wherein the integrated circuit is a prototype integrated circuit and the acts are performed in the order of act (a), then act (b), then act (c), and then act (d).

17. The computer-readable medium of claim 14, wherein the integrated circuit is one in a production of integrated circuits for field use, and the acts are performed in the order of act (c), then act (a), then act (b), and then act (d).

18. A probe card for testing a device-under-test, said probe card comprising:
   (a) a device-under-test interface;
   (b) a tester interface;
   (c) a memory for storing test inputs for the device-under-test; and
   (d) a data translator, the data translator being connected between the memory and the tester interface for formatting test data communicated between the memory and the tester interface.

19. The probe card of claim 18, further comprising a clock generator connected to the tester interface and the device-under-test interface for receiving control signals from the tester interface and transmitting clock signals to the device-under-test.

20. The probe card of claim 18, further comprising control logic coupled to the memory for applying the test inputs for the device-under-test.

21. The probe card of claim 20, further comprising a clock generator connected to the tester interface and the control logic for receiving control signals from the tester interface and transmitting clock signals to the control logic.

22. The probe card of claim 21, further comprising an analog signal generator connected between the tester interface and the device-under-test interface, the analog signal generator configured to receive digital signals representative of an analog test from the tester interface, generate an analog signal based on the digital signals, and transmit the analog signal to the device-under-test interface.

23. The probe card of claim 22, the data translator being further connected between the device-under-test interface and the tester interface for formatting test data communicated between the device-under test interface and the tester interface, and the clock generator being further connected to the device-under-test interface for transmitting clock signals to the device-under-test.

24. The probe card of claim 18, wherein the memory comprises a FIFO.

25. The probe card of claim 18 further comprising a fold-back circuit connecting at least two pins of the device-under-test.

26. The probe card of claim 25, wherein the fold-back circuit comprises a component interface connected to checksum logic.

27. The probe card of claim 18, further comprising an analog signal generator connected between the tester interface and the device-under-test interface, the analog signal generator configured to receive digital signals representative of an analog test from the tester interface, generate an analog signal based on the digital signals, and transmit the analog signal to the device-under-test interface.

28. The probe card of claim 27, further comprising a clock generator connected to the tester interface and the device-under-test interface for receiving clock control signals from the tester interface and transmitting clock signals to the device-under-test.

29. The probe card of claim 18, further comprising a power supply connected to the memory and the data translator and electrically insulated from the device-under-test.

30. The probe card of claim 18, further comprising a direct tester interface for performing tests of the device-under-test directly from a tester.

31. The probe card of claim 18, further comprising a scan test interface for performing scan tests of the device-under-test directly from a tester.

32. A probe card for testing a device-under-test, said probe card comprising:
   (a) a device-under-test interface;
   (b) a tester interface;

(c) an analog signal generator connected between the tester interface and the device-under-test interface, the analog signal generator being configured to receive digital signals representative of an analog test from the tester interface, generate an analog signal based on the digital signals, and transmit the analog signal to the device-under-test inter face; and (d) a data translator electrically connected between the device-under-test interface and the tester interface and formatting test data communicated between the device-under-test interface and the tester interface.

33. The probe card of claim 32, further comprising a clock generator connected to the tester interface and the control logic for receiving control signals from the tester interface and transmitting clock signals to the control logic.

34. The probe card of claim 32 further comprising a fold-back circuit connecting at least two pins of the device-under-test.

35. The probe card of claim 34, wherein the fold-back circuit includes a component interface connected to check-sum logic.

36. The probe card of claim 32, further comprising a power supply connected to the memory and the data translator and electrically insulated from the device-under-test.

37. The probe card of claim 32, further comprising a direct tester interface for performing tests of the device-under-test directly from a tester.

38. The probe card of claim 32, further comprising a scan test interface for performing scan tests of the device-under-test directly from a tester.

39. A probe card for testing a device-under-test, said probe card comprising:
   a. a device-under-test interface;
   b. a tester interface;
   c. a fold-back circuit connecting at least two pins of the device-under-test; and
   d. a data translator electrically connected between the device-under-test interface and the tester interface and formatting test data communicated between the device-under-test interface and the tester interface.

40. The probe card of claim 39, further comprising a clock generator connected to the tester interface and the control logic for receiving control signals from the tester interface and transmitting clock signals to the control logic.

41. The probe card of claim 39, further comprising a power supply connected to the memory and the data translator and electrically insulated from the device-under-test.

42. The probe card of claim 39, further comprising a direct tester interface for performing tests of the device-under-test directly from a tester.

43. The probe card of claim 39, further comprising a scan test interface for performing scan tests of the device-under-test directly from a tester.

44. An integrated circuit comprising:
   (a) a plurality of circuit component blocks connected via a bus;
   (b) a plurality of I/O pins having a corresponding plurality of leads connected to the bus, said I/O pins providing a capability for communication external to the integrated circuit;
   (c) a fold-back circuit for redirecting a signal transmitted on one of the plurality of leads to one of the plurality of pins; and
   (d) fold-back logic for enabling and disabling the fold-back circuit.

45. The integrated circuit of claim 44, further comprising a test port connected to the bus and the circuit component blocks each including a block interface to the system bus.

46. The integrated circuit of claim 45, wherein the test port comprises a communication initiation wrapper and each block interface comprises a target wrapper.

47. The integrated circuit of claim 46, the integrated circuit further comprising a lockable memory connected to the bus via a block interface.

48. A computer-readable medium having stored therein one or more sequence of instructions for specifying an integrated circuit, said one or more sequences of instructions causing one or more processors to perform a plurality of acts, said acts comprising:
   (a) specifying a plurality of circuit component blocks interconnected via a bus;
   (b) specifying a plurality of I/O pins having a corresponding plurality of leads connected to the bus, said I/O pins providing for a capability for communication external to the integrated circuit;
   (c) specifying a fold-back circuit for redirecting a signal transmitted on one of the plurality of leads to one of the plurality of pins; and
   (d) specifying fold-back logic for enabling and disabling the fold-back circuit.

49. The computer-readable medium of claim 48, said acts further comprising specifying a test port connected to the bus and the circuit component blocks each including a block interface to the system bus.

50. The computer-readable medium of claim 49, wherein the test port comprises a communication initiation wrapper and each block interface comprises a target wrapper.

51. The computer-readable medium of claim 50, said acts further comprising specifying a lockable memory connected to the bus via a block interface.

52. A test station for testing a device-under-test, the test station comprising:
   (a) the device-under-test, the device-under-test comprising a memory and test logic to lock at least a portion of the memory during a test of the device-under-test;
   (b) a tester, the tester being electrically connected to the device-under-test; and transmitting digital signals to lock the at least a portion of the memory; and
   (c) a probe card electrically connected to the device-under-test and the tester, said probe card comprising a clock generator for transmitting clock signals to the device-under-test, and a data translator electrically connected between an interface for the device-under-test and the tester interface, the data translator formatting test data communicated between the interface for the device-under-test and the tester interface.

53. The test station of claim 52, wherein the device-under-test further includes a test port connected to a system bus on the device-under-test and component blocks of the device-under-test each include a block interface to the system bus.

54. The test station of claim 53, wherein the test port comprises a communication initiation wrapper and each block interface comprises a target wrapper.

55. The test station of claim 52, wherein the device-under-test comprises a fold-back circuit to input to the device-under-test output signals from the device-under-test, and logic to activate the fold-back circuit.

56. A method of generating tests vectors for testing an integrated circuit at a manufacturing testbench comprising the steps of:
   (a) obtaining functional level test vectors;
   (b) converting the test vectors into a series of message blocks;
   (c) applying an interface protocol to the series of message blocks to generate test vector data; and (d) applying an interface protocol for a device under-test to the test vector data.

57. A system for generating test vectors for testing an integrated circuit at a manufacturing testbench comprising:
   (a) a memory for storing functional level test vectors; and
   (b) a processor connected to the memory for translating the test vectors into message blocks, for applying an interface protocol to the message blocks to generate test vector data, and for applying an interface protocol for a device-under-test to the test vector data.

58. A system for generating test vectors for testing an integrated circuit at a manufacturing testbench comprising:
   (a) a means for storing functional level test vectors; and
   (b) a processing means connected to the means for storing functional level test vectors, said processing means for translating the test vectors into message blocks, applying an interface protocol to the message blocks to generate test vector data, and applying an interface protocol for a device-under-test to the test vector data.

59. A computer-readable medium having stored therein one or more sequence of instructions for generating test vectors for testing an integrated circuit at a manufacturing testbench, said one or more sequences of instructions causing one or more processors to perform a plurality of acts, said acts comprising:
   (a) specifying functional level test vectors;
   (b) translating the test vectors into message blocks;
   (c) applying an interface protocol to the message blocks to generate test vector data; and
   (d) applying an interface protocol for the integrated circuit to the test vector data.

60. A method of generating diagnostic tests for testing an integrated circuit at a manufacturing testbench comprising the steps of:
   (a) obtaining functional level diagnostic tests for virtual component blocks of an integrated circuit design;
   (b) translating the diagnostic tests into timing accurate diagnostic tests;
   (c) converting the timing accurate diagnostic tests into memory load instructions; and
   (d) applying an interface protocol for a device-under-test to the memory load instructions.

61. A computer-readable medium having stored therein one or more sequence of instructions for specifying and testing a manufactured integrated circuit, said one or more sequences of instructions causing one or more processors to perform a plurality of acts, said acts comprising:
   (a) specifying a plurality of virtual component blocks;
   (b) specifying interconnections between the plurality of virtual component blocks;
   (c) specifying a plurality of sets of diagnostic tests for testing manufactured forms of the plurality of virtual component blocks, each set of diagnostic tests corresponding to one of the plurality of virtual component blocks; and
   (d) specifying a set of test vectors for testing the manufactured integrated circuit.

62. A computer-readable medium having stored therein one or more sequence of instructions for generating tests vectors for testing an integrated circuit at a manufacturing testbench, said one or more sequences of instructions causing one or more processors to perform a plurality of acts, said acts comprising:
   (a) specifying functional level test vectors for testing a functional specification of the integrated circuit;
   (b) translating the test vectors into message blocks;
   (c) applying an interface protocol to the message blocks to generate test vector data; and
   (d) applying an interface protocol of the integrated circuit to the test vector data.

63. A method of manufacturing a computer readable medium comprising a design for an integrated circuit and a collection of test inputs for manufacturing and functionally testing a manufactured form of the integrated circuit comprising the steps of:
   (a) designing virtual component blocks to be used in the design of the integrated circuit;
   (b) designing a diagnostic test specific to each virtual component block;
   (c) determining the design for the integrated circuit comprising the virtual component blocks;
   (d) obtaining high level test vectors for the integrated circuit;
   (e) verifying the integrated circuit using the test vectors and the diagnostic tests;
   (f) augmenting the diagnostic tests and the test vectors for a manufacturing environment; and
   (g) packaging the design for the integrated circuit with the augmented test vectors.

* * * * *